(12) United States Patent
Naruse et al.

(10) Patent No.: US 8,304,278 B2
(45) Date of Patent: Nov. 6, 2012

(54) PHOTOELECTRIC CONVERSION APPARATUS AND IMAGE PICKUP SYSTEM USING PHOTOELECTRIC CONVERSION APPARATUS

(75) Inventors: Hiroaki Naruse, Yokohama (JP); Takashi Okagawa, Sagamihara (JP); Ryuichi Mishima, Machida (JP); Nobuhiko Sato, Yokohama (JP); Hiroshi Yuzurihara, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 8 days.

(21) Appl. No.: 12/904,269

(22) Filed: Oct. 14, 2010

(65) Prior Publication Data

US 2011/0027934 A1 Feb. 3, 2011

Related U.S. Application Data

(62) Division of application No. 12/026,623, filed on Feb. 6, 2008, now Pat. No. 7,838,918.

(30) Foreign Application Priority Data

Feb. 23, 2007 (JP) .................................. 2007-044011

(51) Int. Cl.
*H01L 31/18* (2006.01)

(52) U.S. Cl. .................. 438/59; 257/E31.085; 257/292; 257/431

(58) Field of Classification Search .................. 257/225, 257/233, 290, 292, 293, 294, 431, 432, 773, 257/776, E31.085; 438/59
See application file for complete search history.

(56) References Cited

U.S. PATENT DOCUMENTS

| 5,814,886 | A | * | 9/1998 | Mano | 257/734 |
| 6,071,789 | A | | 6/2000 | Yang et al. | 438/396 |
| 6,352,921 | B1 | * | 3/2002 | Han et al. | 438/638 |
| 6,861,686 | B2 | * | 3/2005 | Lee et al. | 257/291 |
| 6,908,857 | B2 | * | 6/2005 | Akamatsu et al. | 438/688 |
| 7,126,102 | B2 | | 10/2006 | Inoue et al. | 250/214 R |

(Continued)

FOREIGN PATENT DOCUMENTS

EP 1 439 582 A2 7/2004

(Continued)

OTHER PUBLICATIONS

Aug. 4, 2011 European Search Report, issued in counterpart European Patent Application No. 10183837.3.

*Primary Examiner* — Long Tran
*Assistant Examiner* — Jordan Klein
(74) *Attorney, Agent, or Firm* — Fitzpatrick, Cella, Harper & Scinto

(57) ABSTRACT

A photoelectric conversion apparatus includes: a first interlayer insulation film disposed on a semiconductor substrate; a first plug disposed in a first hole in the first interlayer insulation film, and serving to electrically connect between a plurality of active regions disposed in the semiconductor substrate, between gate electrodes of a plurality of MOS transistors, or between the active region and the gate electrode of the MOS transistor, not through the wiring of the wiring layer; and a second plug disposed in a second hole in the first interlayer insulation film, the second plug being electrically connected to the active region, wherein a wiring arranged over the second plug and closest to the second plug is electrically connected to the second plug, and the wiring electrically connected to the second plug forms a portion of dual damascene structure. By such a structure, incidence efficiency of light onto a photoelectric conversion element can be improved.

12 Claims, 6 Drawing Sheets

U.S. PATENT DOCUMENTS

| | | | |
|---|---|---|---|
| 7,176,125 B2* | 2/2007 | Liaw | 438/637 |
| 7,442,572 B2* | 10/2008 | Sohn | 438/59 |
| 7,838,918 B2* | 11/2010 | Naruse et al. | 257/292 |
| 7,842,988 B2* | 11/2010 | Okagawa et al. | 257/292 |
| 2001/0030703 A1 | 10/2001 | Inoue | 348/308 |
| 2002/0117722 A1* | 8/2002 | Osada et al. | 257/379 |
| 2004/0000669 A1* | 1/2004 | Yamamura | 257/72 |
| 2004/0140564 A1 | 7/2004 | Lee et al. | 257/758 |
| 2004/0169127 A1 | 9/2004 | Ohkawa | 250/214.1 |
| 2005/0012166 A1* | 1/2005 | Choi | 257/414 |
| 2005/0218519 A1* | 10/2005 | Koike et al. | 257/756 |
| 2006/0019488 A1 | 1/2006 | Liaw | 438/637 |
| 2006/0049439 A1* | 3/2006 | Oh et al. | 257/292 |
| 2006/0151812 A1* | 7/2006 | Watanabe | 257/222 |
| 2006/0163628 A1* | 7/2006 | Mori et al. | 257/291 |
| 2006/0172450 A1 | 8/2006 | Tazoe et al. | 438/57 |
| 2006/0208289 A1* | 9/2006 | Ohkawa et al. | 257/291 |
| 2006/0255463 A1* | 11/2006 | Won | 257/751 |
| 2006/0278896 A1* | 12/2006 | Inoue | 257/215 |
| 2007/0205439 A1 | 9/2007 | Okita et al. | 257/228 |
| 2008/0054388 A1 | 3/2008 | Nakata et al. | 257/432 |
| 2008/0057615 A1* | 3/2008 | Okagawa et al. | 438/73 |
| 2008/0203509 A1 | 8/2008 | Mishima et al. | 257/432 |

FOREIGN PATENT DOCUMENTS

| | | |
|---|---|---|
| JP | 9-55440 A | 2/1997 |
| JP | 11-135623 A | 5/1999 |
| JP | 11-186386 A | 7/1999 |
| JP | 2001-298175 A | 10/2001 |
| JP | 2002-368203 A | 12/2002 |
| JP | 2002368203 A * | 12/2002 |
| JP | 2003-324189 A | 11/2003 |
| JP | 2004-221527 A | 8/2004 |
| JP | 2004-221527 A1 | 8/2004 |
| JP | 2005-277390 A | 10/2005 |
| JP | 2006-190891 A | 7/2006 |
| KR | 10-2004-0108240 A | 12/2004 |

* cited by examiner

PHOTOELECTRIC CONVERSION APPARATUS AND IMAGE PICKUP SYSTEM USING PHOTOELECTRIC CONVERSION APPARATUS

CROSS REFERENCE TO RELATED APPLICATION

This application is a division of U.S. application Ser. No. 12/026,623, filed on Feb. 6, 2008, the entire disclosure of which is hereby incorporated by reference herein.

BACKGROUND OF THE INVENTION

1. Field of the Invention

The present invention relates to a photoelectric conversion apparatus, and more particularly to a structure of contact, via and wiring in a photoelectric conversion apparatus including multilayered wiring structure.

2. Description of the Related Art

Photoelectric conversion apparatuses such as CCD type photoelectric conversion apparatuses or MOS type photoelectric conversion apparatuses are used for digital still cameras and video cameras. The MOS type photoelectric conversion apparatus includes a photoelectric conversion region including MOS transistors and photodiodes, and a peripheral circuit region including MOS transistors for outputting signals of the photoelectric conversion region, and for driving the photoelectric conversion apparatus. The photoelectric conversion region and the peripheral circuit region can be manufactured through common process steps by the CMOS manufacturing process.

In the case of the MOS type photoelectric conversion apparatus, as compared to the CCD type photoelectric conversion apparatus, the number of wires for driving respective MOS transistors and the number of wires for reading out signals are increased. Accordingly, there is used a multilayered wiring structure in which plural wiring layers are stacked through interlayer insulation films. As material of such wire, aluminum has been used in the related art in many cases. On the contrary, it is described in the Japanese Patent Application Laid-Open No. 2004-221527 that copper is used as wiring material in order to provide finer wiring pitch, or in order to achieve the thin film thickness of the wiring layer to reduce height of the photoelectric conversion apparatus. In addition, in order to attain realization of a larger number of pixels of digital still cameras and video cameras, realization of fining of pixels of the photoelectric conversion apparatus is studied.

An object of the present invention is to provide a MOS type photoelectric conversion apparatus in which incidence efficiency of light onto a photoelectric conversion element is improved without lowering the degree of freedom of wiring layout.

SUMMARY OF THE INVENTION

In accordance with the present invention, there is provided a photoelectric conversion apparatus comprising a semiconductor substrate, a photoelectric conversion element and a MOS transistor disposed in the semiconductor substrate, a multilayered wiring structure including a stacking of a plurality of wiring layers having a plurality of wirings, and interlayer insulation films mutually isolating wiring layers, wherein the photoelectric conversion apparatus comprises a first interlayer insulation film disposed on the semiconductor substrate, a first plug disposed in a first hole in the first interlayer insulation film, connecting between active regions disposed in the semiconductor substrate, between gate electrodes of the MOS transistors, or between the active region and the gate electrode of the MOS transistor, not through the wiring of the wiring layer, and a second plug disposed in a second hole in the first interlayer insulation film, and electrically connected to the active region, wherein a wiring arranged over the second plug and closest to the second plug is electrically connected to the second plug through a third plug, and the third plug and the wiring arranged closest to the second plug form a dual damascene structure.

Other features and advantages of the present invention will be apparent from the following description taken in conjunction with the accompanying drawings, in which like reference characters designate the same or similar parts throughout the figures thereof.

Figure 1:
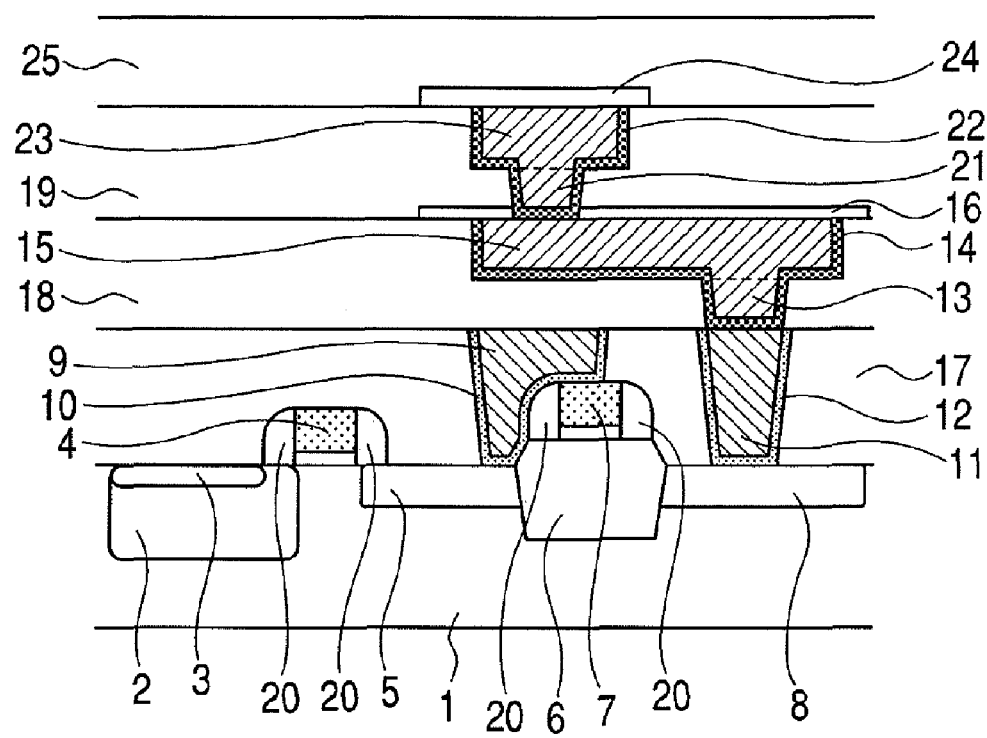
FIG. 1 is a cross sectional diagram illustrating, in a model form, a photoelectric conversion apparatus of a first exemplary embodiment.

The accompanying drawings, which are incorporated in and constitute a part of the specification, illustrate embodiments of the invention and, together with the description, serve to explain the principles of the invention.

DESCRIPTION OF THE EMBODIMENTS

As disclosed in the Japanese Patent Application Laid-Open No. 2004-221527, in the case where copper is used as a wiring material, the degree where copper is diffused within the interlayer insulation film is large as compared to aluminum. The following description is made in the above Patent Literature. When copper reaches a semiconductor substrate by diffusion, there are instances where the performance of the photoelectric conversion element may be lowered so that noises are increased. Accordingly, in order to suppress noises, it is desirable that titanium or tungsten is used as a material of the lower contact in place of copper.

Moreover, in the photoelectric conversion apparatus, an aperture where light is incident on the photoelectric conversion element is prescribed by wiring. Accordingly, in order to enhance incidence efficiency of light to improve the sensitivity, there is required a wiring layout in which an aperture required for allowing light to be incident onto the photoelectric conversion element is caused to be broad. Since a necessary number of wiring layers of the MOS type photoelectric conversion apparatus is larger than that of the CCD type photoelectric conversion apparatus, the degree of freedom of the wiring layout is low. Further, according as pixel becomes fine, the degree of freedom of the wiring layout in the MOS type photoelectric conversion apparatus would be further lowered.

In accordance with the present invention, a MOS type photoelectric conversion apparatus in which incidence efficiency of light onto a photoelectric conversion element is improved can be provided.

A photoelectric conversion apparatus of the present invention includes a plug disposed in a single hole. By this plug, plural active regions disposed in a semiconductor substrate can be electrically connected to each other, gate electrodes of plural MOS transistors disposed therein can be electrically connected to each other, and the active region and the gate electrode of the MOS transistor can be electrically connected. Since the plug can be deemed to be shared with respect to plural regions where electrical connection is made, this contact structure is called shared contact. Namely, in the case of the related art, contact holes are formed by the number of members subject to electrical connection to make electrical connection through wiring layers. On the contrary, by making connection using the shared contact, plural contacts and wiring layers for connecting those contacts can be eliminated. Thus, the number of wirings is decreased. As a result, the degree of freedom of the wiring layout can be enhanced.

Further, electrical connection between the active region and the wiring layer, or electrical connection between the gate electrode and the wiring layer is caused to be of stacked structure of ordinary contact plug and dual damascene (stacked contact structure). Namely, the first wiring layer is formed by dual damascene process to form a portion of the dual damascene structure. In accordance with such a configuration, wiring quantity can be reduced. Further, wire can be disposed on the shared contact. Accordingly, the degree of freedom of the wiring layout can be improved. As a result, aperture ratio can be also improved. Thus, a photoelectric conversion apparatus in which incidence efficiency of light onto the photoelectric conversion element is improved can be provided.

Here, as the stacked contact, it is also conceivable to stack a plug of tungsten thereafter to form wiring with a single damascene structure. However, it is difficult to achieve the thin thicknesses of a stacked tungsten of the upper part and the interlayer insulation film in which the tungsten plug is disposed. This is because it is required to take large process margin of the CMP process performed after tungsten is formed as film as compared to the etching process in the damascene process. Accordingly, it is required to thicken the thickness of the interlayer insulation film. On the contrary, by employing a structure in which the plug and the dual damascene structure are staked, the height of the device can be reduced.

Accordingly, in the present invention, a plug directly in contact with the active region and the gate electrode is formed by the process for forming only plug thereafter to form the lowermost wiring layer and plug by dual damascene. For this reason, the degree of freedom of layout of wiring can be improved, and height can be further reduced. By realization of reduced height, the aspect ratio of the aperture part is reduced. Thus, the range of incident angle of incident light can be also enlarged. From facts as described above, a photoelectric conversion apparatus in which incidence efficiency of light onto a photoelectric conversion element is improved can be provided.

Hereinafter, a semiconductor substrate serving as a material substrate will be represented as "substrate", but also includes the case where a material substrate as described below is processed. For example, a member in the state where one or plural semiconductor regions is or are formed, a member in the middle of a series of manufacturing process steps, or a member after undergone a series of manufacturing process steps may be called a substrate. The active region is a semiconductor region partitioned by an element isolation region such as LOCOS, and is a region where various elements are formed, or a region forming a part of element. For example, a drain region or source region of a transistor is included therein. Moreover, the direction from the principal surface of the semiconductor substrate to the inside of the substrate refers to "lower direction", and the direction opposite to the above refers to "upper direction".

Further, the contact is electrical connecting part between the active region and the wiring, or between the gate electrode and the wiring, and the via is an electrical connecting part between the contact and the wiring, or between wirings. Each of the contact and the via includes a plug disposed in a contact hole or via hole, a connecting part between the plug and the active region or other conductor such as wire, and a barrier metal. The barrier metal is a film provided for the purpose of suppressing alloy reaction between a plug material and an insulation film or substrate, or diffusion reaction into an insulation film or substrate of a plug material. For similar purpose, barrier metal is provided also at wiring.

Further, the dual damascene structure is the structure of wiring and plug formed by the damascene process, and the single damascene structure is the structure of wiring formed by the damascene process.

Further, the aperture of the photoelectric conversion element is an incident aperture of light onto the photoelectric conversion element, and is generally prescribed by a pattern by wiring or a light shielding film. The pattern for prescribing the aperture is a pattern for determining the outer edge of a region incident onto the photoelectric conversion element of light. By performing optical simulation of the optical conversion apparatus cross section, a pattern which determines the aperture can be recognized.

Exemplary embodiments of the present invention will now be described in detail with reference to the attached drawings.

(Circuit Configuration of Photoelectric Conversion Apparatus)

Figure 5:
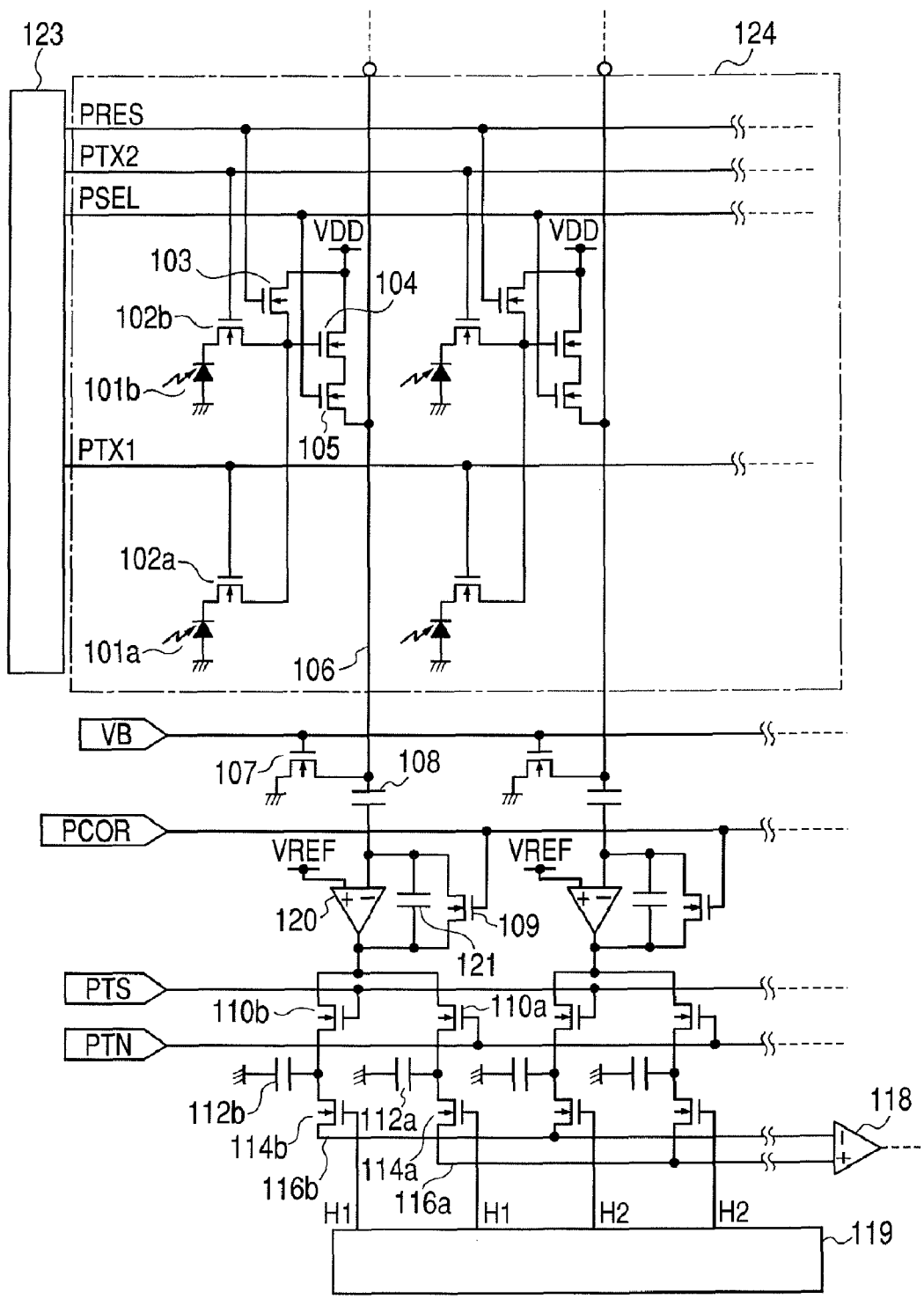
FIG. 5 illustrates an example of a circuit configuration of the photoelectric conversion apparatus.

First, the circuit configuration of a MOS type photoelectric conversion apparatus to which the present invention can be applied will be described. FIG. 5 illustrates one example of the circuit configuration of the MOS type photoelectric conversion apparatus. The MOS type photoelectric conversion apparatus includes a pixel unit 124 including photoelectric conversion elements 101*a* and 101*b*, transfer MOS transistors 102*a* and 102*b* for transferring electric carriers of the photoelectric conversion elements, a reset MOS transistor 103 for resetting the photoelectric conversion elements 101*a*, 101*b* and the drain region of each transfer MOS transistor, and an amplification MOS transistor 104 for amplifying electric carriers to output a signal corresponding to the electric carriers to a signal line 106. The amplification MOS transistor forms a part of the source-follower circuit. The pixel unit 124 further includes a selecting MOS transistor 105 for controlling read-out operation to the signal line. The transfer transistors, the reset transistor, the amplification MOS transistor and the selecting MOS transistor are assumed as read-out transistors. In FIG. 5, the transistors 103, 104 and 105 included in these read-out transistors are shared by the two photoelectric conversion elements 101*a*, 101*b*.

Further, there are provided, for each signal line 106, a clamping circuit including a clamping capacitor 108, a column amplification unit including an amplifier 120, and a signal holding circuit including capacitors 112*a* and 112*b*. The circuit configuration forming the photoelectric conversion apparatus further includes scanning circuits 123 and 119. Signals generated by the photoelectric conversion elements 101a and 101b are read out from the signal output line 106 by the read-out transistors driven by the scanning circuits 123 and 119. Further, noises are removed from those signals at the clamping circuit or the signal holding unit. The signals thus obtained are output to horizontal signal lines 116a and 116b. Finally, a differential output thereof is output from the differential amplifier 118. The circuit components except for the pixel unit 124 such as the scanning circuits and clamping circuit will be collectively called "a peripheral circuit unit".

While the configuration of the present invention will be described by taking an example of exemplary embodiments, the present invention is not limited to these exemplary embodiments, but those exemplary embodiments may be changed or combined as occasion demands within the scope which does not depart from the gist of the invention.

First Exemplary Embodiment

In the present embodiment, there is employed a shared contact structure in which the semiconductor region and the gate electrode of the amplification transistor are connected. Further, there is employed wiring of a dual damascene structure electrically connected to a plug. The cross sectional model diagram of the pixel part of the photoelectric conversion apparatus of the present embodiment is illustrated in FIG. 1, and description thereof will be made in detail.

In FIG. 1, the photoelectric conversion element includes a semiconductor region 1 of the first conductivity type provided on one principal surface of a substrate, a semiconductor region 2 of the second conductivity type, and a semiconductor region 3 of the first conductivity type which covers the second conductivity type semiconductor region 2, wherein the semiconductor region 1 may be a well or a substrate of the first conductivity type. The part designated by reference numeral 4 is a gate electrode of a transfer MOS transistor for transferring electric carriers of the photoelectric conversion element accumulated in the second conductivity semiconductor region 2. The photoelectric conversion element further includes a semiconductor region 5 of the second conductivity type where electric carriers of the photoelectric conversion element are transferred (floating diffusion region which will be hereinafter abbreviated as FD region), and an element isolation region 6, wherein this element isolation region 6 includes STI (Shallow Trench Isolation) structures. The part designated by reference numeral 7 is gate electrode of the amplification MOS transistor forming the source-follower circuit, and the part designated by reference numeral 8 is an active region within pixel. The active region refers to a semiconductor region, e.g., photoelectric conversion element, source region or drain region of a MOS transistor or a well where they are disposed. Moreover, there are cases where the gate electrode may double as wire for supplying voltage to the gate electrode. The photoelectric conversion apparatus further includes a plug 9 of contact (shared contact) for connecting the FD region 5 and the gate electrode 7 of the amplification MOS transistor. The shared contact structure is a contact for connecting the active region and the gate electrode by the plug disposed in the single contact hole. The photoelectric conversion apparatus further includes a plug 11 for electrically connecting the active region 8 and plug 13 and wiring 15 of the dual damascene structure, and dual damascene structures 13, 14, 15 respectively serving as plug, barrier metal and wiring disposed at the upper part thereof. In this case, the stacked contact structure is formed by the plug 11 and the plug 13 so that the active region 8 and the wiring 15 are electrically connected. Further, dual damascene structures 21, 22, 23 respectively serving as a plug, barrier metal and wiring are disposed at the upper part of the wiring 15. Here, the photoelectric conversion apparatus further includes barrier metals 10, 12 for plugs 9, 11, and diffusion prevention films 16, 24 for covering the upper surfaces of the wirings. The diffusion prevention films 16 and 24 serve to suppress diffusion of the wiring material. The photoelectric conversion apparatus further includes first, second, third and fourth interlayer insulation films 17, 18, 19, for isolating wirings or contacts. The first interlayer insulation film 17 is disposed on the semiconductor substrate. Moreover, the photoelectric conversion apparatus further includes side walls 20 for transfer the MOS transistor and amplification the MOS transistor. While the wiring 15 is disposed on the upper part of the plug 11 of the shared contact structure in FIG. 1, there may be instead disposed a wiring included in the same wiring layer as the wiring 15, which is not electrically connected to the plug 11 of the shared contact structure.

The plugs 9 and 11 are disposed at the first interlayer insulation film 17. The second interlayer insulation film 18 is disposed on the first interlayer insulation film 17. In correspondence with the plug 11, plug 13 and wiring 15 of the dual damascene structure are disposed at the second interlayer insulation film 18. In accordance with the configuration of the present embodiment, wiring quantity can be reduced by the shared contact structure. Moreover, wiring can be disposed on the upper part of the shared contact structure. Further, the height of the stacked contact part can be reduced. Accordingly, incidence efficiency of light onto the photoelectric conversion element can be improved while improving the degree of freedom of plane layout of wiring.

Moreover, the shared contact structure is applied to an electrical connection between the FD region and the gate electrode of the amplification MOS transistor so that the degree of freedom of the wiring layout in the vicinity of the photoelectric conversion element can be improved. Further, in the case where wirings are disposed on the upper part of the shared contact structure, light-shielding of the FD region can be performed while improving the degree of freedom of the wiring layout.

Figure 2A:
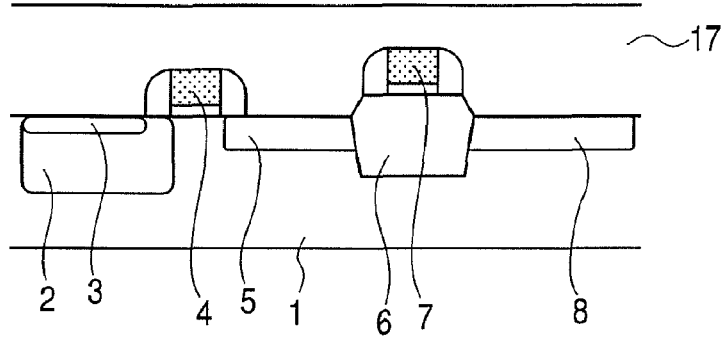
FIGS. 2A, 2B and 2C are model diagrams illustrating manufacturing process steps of the photoelectric conversion apparatus.

An example of a method of manufacturing the photoelectric conversion apparatus of the present embodiment will now be described with reference to FIG. 2. Reference numerals are caused to respectively correspond to those of FIG. 1.

By using the typical semiconductor process, the element isolation region 6, semiconductor region 3 of the second conductivity type, and FD region 5 are formed within the semiconductor region 1. The gate electrode 4 containing, e.g., polysilicon and the gate electrode 7 including wiring are formed on the substrate thereafter to form the first interlayer insulation film 17 containing a silicon oxide film to form the structure of FIG. 2A.

Figure 2B:
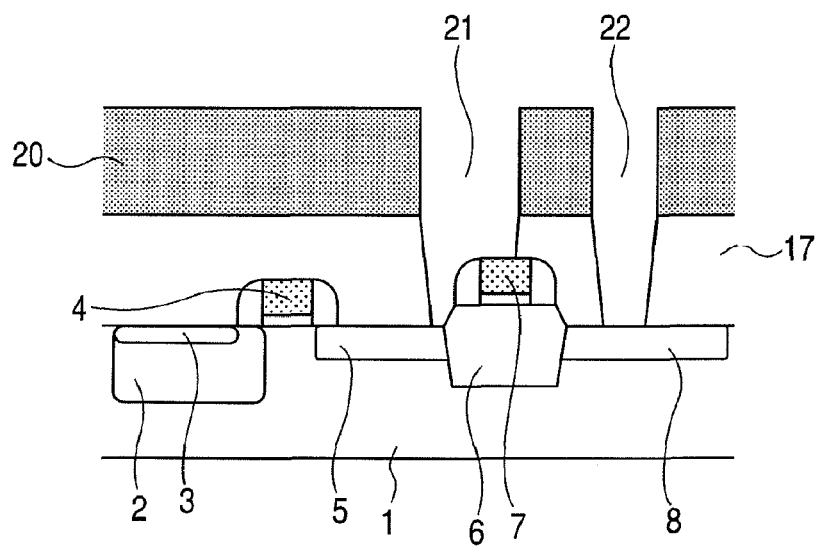

Next, as illustrated in FIG. 2B, photoresist coated on the first interlayer insulation film 17 is caused to undergo patterning to form resist pattern 20. With the resist pattern 20 as a mask, apertures for contact (contact holes) 21 and 22 are formed at the first interlayer insulation film 17 by etching. The contact hole 21 is an aperture for forming the shared contact structure.

After the resist pattern 20 is removed, films for forming the barrier metals 10 and 12 are formed. Metallic films (e.g., tungsten film) for forming the plugs 9 and 11 are formed on the upper layer relative thereto. The tungsten film is formed through the CVD process by using, e.g., WF6 gas. As barrier metal in the case where the plug is tungsten, there are mentioned single layer film containing Ti or TiN, and laminated film containing both. By removing the barrier metal and the metallic film by etching at the same time, the plugs 9 and 11 including the barrier metals 10 and 12 are formed. Thus, there is provided the structure of FIG. 2C. As a method of removing metallic film, the CMP (Chemical Mechanical Polishing) process may be used in addition to etching. While tungsten is used as material of the plugs 9 and 11, there may be used conductive material having a diffusion coefficient smaller than that of the plug 13. By using such a material, diffusion of material into the substrate can be reduced.

Figure 3A:
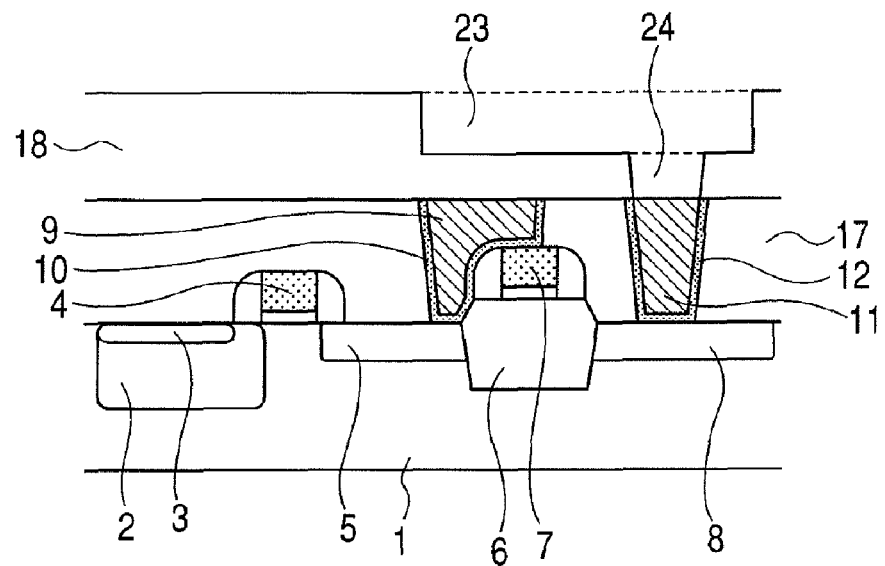
FIGS. 3A and 3B are model diagrams illustrating the manufacturing process steps of the photoelectric conversion apparatus.

After the second interlayer insulation film 18 containing a silicon oxide film is formed, a dual damascene structure is formed by the damascene process. First, a groove for forming the wiring 15 is formed to form a groove (via hole) for forming the plug 13. Photoresist coated on the second interlayer insulation film 18 is caused to undergo patterning to form resist pattern. Further, etching is performed with the resist pattern as a mask to form a groove 23 for the wiring 15. After the resist pattern is removed, photoresist is coated again to form resist pattern. With the resist pattern as a mask, a groove 24 of the plug 13 forming the via is formed. By removing the resist pattern, there is provided the structure of FIG. 3A. While the groove 23 is first formed in the present embodiment, the groove 24 for the plug 13 may be formed before the forming of the groove 23. Moreover, in the case where there is provided a wiring which is not connected to the plug of the first interlayer insulation film 17, only groove for wiring may be formed at the second interlayer insulation film 18 by the same process step as that of the groove for the wiring 15.

Figure 3B:
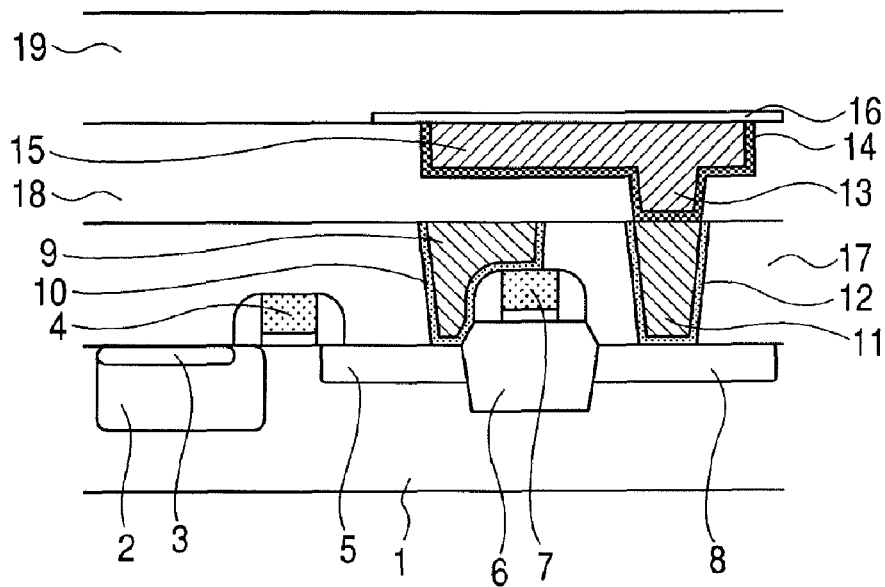

Thereafter, barrier metal is formed as a film thereafter to deposit, e.g., copper in the grooves 23 and 24. After copper is deposited, excess copper and excess barrier metal are polished by the planarization process such as CMP to form the plug 13 and wiring 15. Next, a film serving as a diffusion prevention film is formed on the wiring 15 to allow the diffusion prevention film 16 to undergo patterning over a predetermined range. Thus, the structure of FIG. 3B is provided. The barrier metal 14 for the wiring of copper is a Ta-based single layer film, e.g., TaN single layer film. The diffusion prevention film 16 is, e.g., silicon carbide or silicon nitride. In the case where these materials of the diffusion prevention film have refractive index different from that of material (e.g., silicon oxide film) of the interlayer insulation film, when the diffusion prevention film is disposed on the upper part of the photoelectric conversion element, reflection takes place so that incident light quantity is reduced. Accordingly, it is desirable that the diffusion prevention film is formed within the range which does not exist across the optical path of the photoelectric conversion element and permits suppression of diffusion of wiring material.

Further, e.g., formation of the interlayer insulation film and dual damascene process are repeated a predetermined number of times with respect to the upper part thereof so that the photoelectric conversion apparatus including the multilayered wiring structure is formed. However, the present invention is not limited to such a form or implementation.

Here, attention is drawn to the part where the plug 11 and plug 13 of the dual damascene structure are electrically connected. It is desirable that the upper part area of the plug 11 of this part is caused to be larger than the bottom part area of the plug 13. By employing such an arrangement, even in the case where positional shift in the process is taken into consideration, offset quantity (protrusion quantity) of the plug 13 from the plug 11 can be reduced.

Moreover, there are many cases where the aspect ratio of the plug 11 takes a high value as compared to the plug 13. Thus, it is desirable for improving burying characteristic in the burying process of metallic material of plug that the upper part area of the contact hole of the plug 11 is large. Further, in the case where tungsten is used as the plug 11 and copper is used as the plug 13, since burying characteristic of copper is good as compared to tungsten, the bottom part area of hole of the plug 13 can be reduced.

Second Exemplary Embodiment

In the present embodiment, an etching stop film is included at the lower part of the wiring 15 of the dual damascene structure in addition to the structure of the first exemplary embodiment.

Figure 2C:
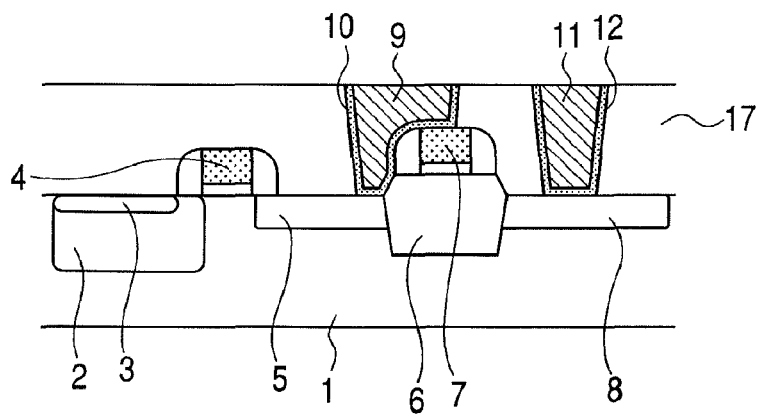
Figure 4A:
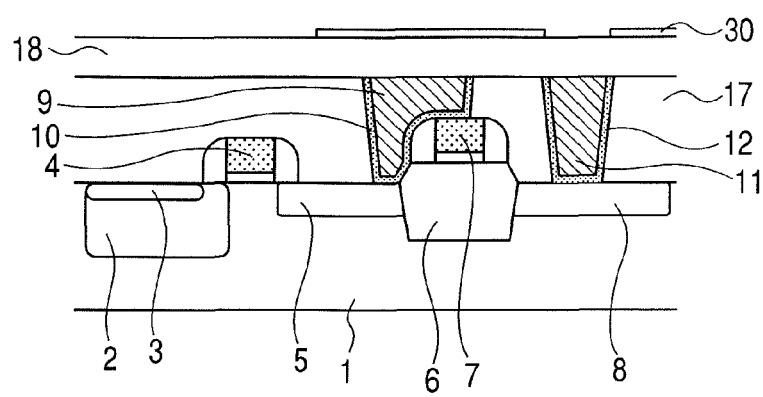
FIGS. 4A, 4B and 4C are model diagrams illustrating the manufacturing process steps of the photoelectric conversion apparatus.

The configuration thereof will be described while describing a manufacturing method with reference to FIGS. 2 and 4. After the structure up to FIG. 2C is formed, a second interlayer insulation film 18 is formed as illustrated in FIG. 4A so as to have a predetermine height. Further, a film functioning as an etching stop film is formed on the second interlayer insulation film 18. As the film functioning as this etching stop film, there are, e.g., silicon carbide and silicon nitride. Next, an aperture is formed, with resist pattern as a mask, at a part corresponding to the aperture for the plug 13 of the film functioning as an etching stop film to form an etching stop film 30. At this time, it is desirable to also form an aperture at the upper part of the photoelectric conversion element. Thus, the structure of FIG. 4A is provided.

Figure 4B:
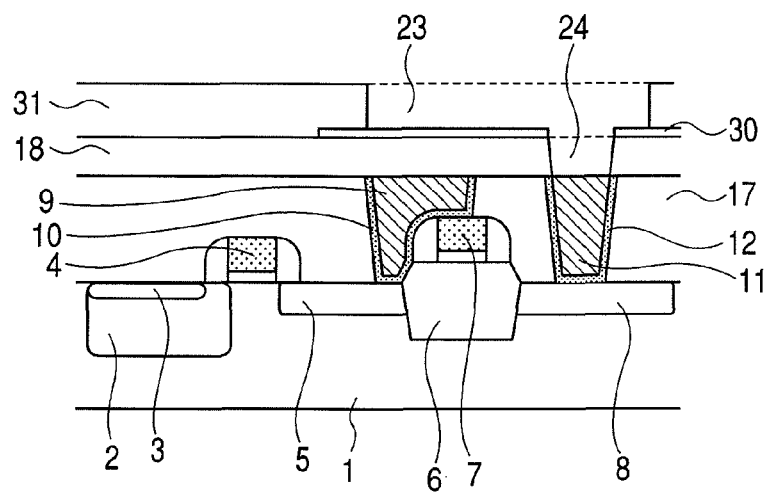

Thereafter, a third interlayer insulation film 31 is formed to form the groove 23 for wiring with resist pattern as a mask. Further, after the resist pattern is removed, resist patterning is formed again to form a groove 24 (via hole) for plug. Furthermore, the resist patterning is removed. Thus, the structure of FIG. 4B is provided.

Figure 4C:
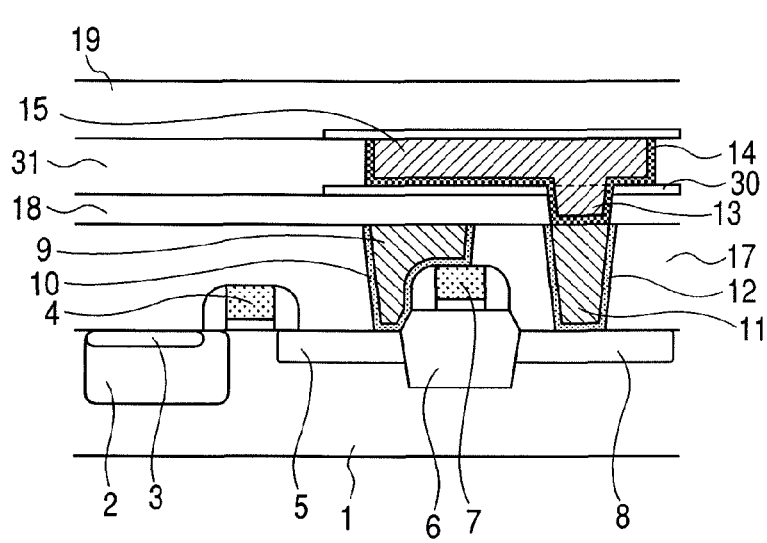

After the barrier metal 14 is formed, copper is deposited in the grooves 23 and 24. After copper is deposited, excess copper and excess barrier metal are polished by the CMP to thereby form the plug 13 and wiring 15. Next, a diffusion prevention film for protecting the wiring 15 is formed to perform etching with resist pattern as a mask to thereby form the diffusion prevention film 16 within a predetermined range. Thus, the structure of FIG. 4C is provided. Examples of the material of the barrier metal 14 or diffusion prevention film 16 include materials described in the first exemplary embodiment. Process steps subsequent thereto are similar to those of the first exemplary embodiment.

In the present embodiment, in forming the groove 24 for plug by the dual damascene process, a hard mask including the etching stop film 30 is used. By using such hard mask, the height of the plug 13 can be determined by the film thickness of the second interlayer insulation film 18. For this reason, the distance between the wiring 15 and the plug 9 disposed at the lower part thereof becomes stable. As a result, current leakage between the wiring 15 and the plug 9 becomes difficult to take place. Thus, yield of the photoelectric conversion apparatus including stacked structure can be improved.

As stated above, in accordance with the present invention, a higher quality photoelectric conversion apparatus can be provided. In addition, materials and manufacturing methods are not limited to those of respective exemplary embodiments, and the conductivity type of the semiconductor substrate, the configuration of pixels, and wiring layout are not limited to the described configurations. For example, the number of stacked layers of plugs of the stacked contact structure may be set as occasion demands.

(Application to an Image Pickup System)

Figure 6:
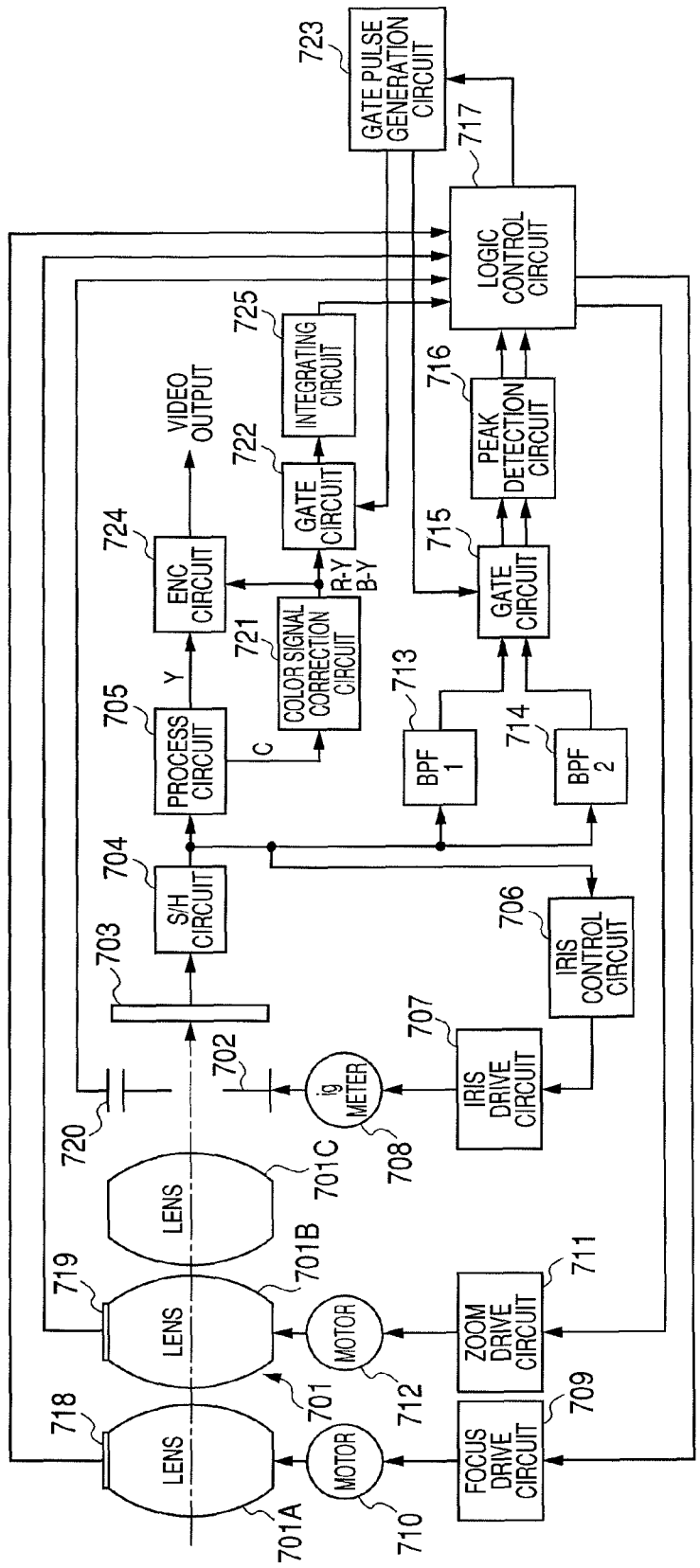
FIG. 6 is a block diagram illustrating an example of an image pickup system.

FIG. 6 is a block diagram in the case where the photoelectric conversion apparatus each of which has been described in the above-described exemplary embodiments is applied to a video camera which is one example of the image pickup system. As another image pickup system, there is mentioned digital still camera. Description will now be described in detail with reference to FIG. 6.

This image pickup system includes an optical system 701 including a focus lens 701A for performing focus adjustment by an imaging lens, a zoom lens 701B for performing zooming operation, and a lens 701C for image formation. Further, the optical system includes an iris and shutter 702. The image pickup system further includes a photoelectric conversion apparatus 703 for performing photoelectric conversion of an object image formed on the imaging surface to provide an electric image pickup signal. As the photoelectric conversion apparatus 703, there is used either one of photoelectric conversion apparatuses which have been described in the respective exemplary embodiments. The image pickup system further includes a sampling and holding circuit (S/H circuit) 704 for sampling and holding a photoelectric conversion signal which is an output signal of the photoelectric conversion apparatus 703 to amplify level, and serves to output a video signal.

The image pick-up system further includes a process circuit 705 for implementing predetermined processing such as gamma correction, color separation, or blanking processing to the video signal which is output from the sampling and holding circuit 704 to output a luminance signal Y and a chroma signal C. The image pickup system further includes a color signal correction circuit 721 for performing correction of white balance and color balance with respect to the chroma signal C which has been output from the process circuit 705 to output corrected signal components thus obtained as color difference signals R-Y and B-Y. Moreover, the image pick-up system further includes an encoder circuit (ENC circuit) 724 for modulating the luminance signal Y which has been output from the process circuit 705 and the color difference signals R-Y, B-Y which have been output from the color signal correction circuit 721 to output a modulated signal thus obtained as a standard television signal. Further, the standard television signal thus obtained is delivered to video recorder (not shown) or electronic view-finder such as monitor electronic view finder (EVF). The image pick-up system further includes an iris control circuit 706 for controlling an iris drive circuit 707 on the basis of a video signal delivered from the sampling and holding circuit 704. Further, the image pickup system is configured to allow an ig meter (iris galvanometer) 708 to be automatically controlled with a view to controlling aperture quantity of the iris 702 so that level of the video signal results in a predetermined value of a predetermined level.

The image pick-up system further includes band-pass filters (BPF) 713 and 714 for extracting high frequency components necessary for performing in-focus detection from the video signal which has been output from the sampling and holding circuit 704. Signals which have been output from the first band-pass filter 713 (BPF1) and the second band-pass filter 714 (BPF2) respectively having bandwidth limitations different from each other are gated by a gate circuit 715 and focus gate frame. A peak value is detected at a peak detecting circuit 716, and is held thereat. Simultaneously therewith, the signal thus detected is input to a logic control circuit 717. This signal is called focus voltage. Thus, focus is adjusted by this focus voltage.

Moreover, the image pick-up system further includes a focus encoder 718 for detecting movement position of the focus lens 701A, a zoom encoder 719 for detecting in-focus of the zoom lens 701B, and an iris encoder 720 for detecting aperture quantity of the iris 702. These detection values of the encoders are delivered to the logic control circuit 717 for performing system control.

The logic control circuit 717 performs in-focus detection with respect to an object on the basis of a video signal corresponding to the inside of the in-focus detection region which has been set to perform focus adjustment. Namely, peak value information of high frequency components which have been delivered from respective band-pass filters 713, 714 are taken in. Thereafter, the focus lens 701A is driven so that the focus lens 701A is located at the position where peak value of the high frequency component becomes maximum. To realize this, control signals such as rotational direction, rotational velocity, rotation or stop of a focus motor 710 are delivered to a focus drive circuit 709. Thus, the focus motor 710 is controlled.

When zoom is instructed, a zoom drive circuit 711 rotates a zoom motor 712. When the zoom motor 712 is rotated, the zoom lens 701B is moved. Thus, zooming operation is performed. The process circuit 705 and logic control circuit 717 are generally called signal processing circuit as occasion may demand.

By using, as such an image pickup system, the photoelectric conversion apparatus of the present invention in which incident light quantity onto the photoelectric conversion element is increased, and noises are small, image pickup system with high S/N ratio can be provided.

As stated above, in accordance with the present invention, higher quality photoelectric conversion apparatus and higher quality image pickup system can be provided. Further, materials and manufacturing methods are not limited to those of the respective exemplary embodiments, and the conductivity type of the semiconductor substrate, the configuration of pixels and wiring layout are not limited to the described configurations. For example, copper wiring and aluminum wiring may be mixed in the stacked wiring structure, and may be thus set as occasion demands. In addition, the present invention is not necessarily limited to photoelectric conversion apparatus, but may be applied to semiconductor integrated circuit, e.g., SRAM.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-044011, filed Feb. 23, 2007, which is hereby incorporated by reference herein in its entirety.

What is claimed is:

1. A manufacturing method of a photoelectric conversion apparatus that includes a semiconductor substrate, a photoelectric conversion element and a MOS transistor disposed in the semiconductor substrate, and a multilayered wiring structure including a stacking of a plurality of wiring layers having a plurality of wirings and interlayer insulation films mutually isolating the wiring layers, wherein the manufacturing method comprises steps of:

forming a gate electrode of the MOS transistor, and a plurality of active regions;

forming a first interlayer insulation film on the semiconductor substrate;

forming a first hole in the first interlayer insulation film;

forming a metal film in the first hole, to form a first plug mutually connecting between the active regions, between gate electrodes of a plurality of MOS transistors, or between an active region and the gate electrode of the MOS transistor;

forming a second hole in the first interlayer insulation film;

forming a metal film in the second hole, to form a second plug connected electrically to any of the active regions;

forming a second interlayer insulation film covering the first and second plugs; and forming a dual damascene structure in the second interlayer insulation film by a dual damascene process, the dual damascene structure being connected to the second plug.

2. The manufacturing method according to claim 1, wherein the step of forming the dual damascene structure includes:

forming a groove for a plurality of wirings of a wiring layer, forming a third hole in a region corresponding to an upper portion of the second plug, and forming a metal film in the groove and the third hole.

3. The manufacturing method according to claim 2, wherein an area of an upper surface of the second plug is larger than an area of a lower surface of the third hole.

4. The manufacturing method according to claim 2, wherein the metal film formed in the groove and the third hole are formed from copper.

5. The manufacturing method according to claim 4, wherein the metal films forming the first and second plugs contain tungsten.

6. The manufacturing method according to claim 2, further comprising a step of forming a barrier metal in the groove and the third hole, before the forming of the metal film in the groove and the third hole.

7. The manufacturing method according to claim 1, wherein, after the forming of the dual damascene structure, the dual damascene process is conducted again a single time or a plurality of times.

8. The manufacturing method according to claim 7, wherein a copper wiring is formed according to the dual damascene process.

9. The manufacturing method according to claim 8, further comprising steps of:

forming a diffusion prevention film on the copper wiring; and forming an opening in the diffusion prevention film corresponding to an upper portion of the photoelectric conversion element.

10. The manufacturing method according to claim 1, further comprising steps of:

forming a barrier metal in the first hole before the forming of the first plug; and forming a barrier metal in the second hole before the forming of the second plug.

11. The manufacturing method according to claim 10, wherein the barrier metal contains titanium.

12. The manufacturing method according to claim 1, wherein the photoelectric conversion apparatus includes a transfer MOS transistor for transferring a charge generated in the photoelectric conversion element, a floating diffusion region as the active region into which the charge is transferred by the transfer MOS transistor and an amplifying MOS transistor for outputting a signal based on a potential of the floating diffusion region, and wherein the first plug connects electrically the floating diffusion region to the gate electrode of the amplifying MOS transistor.

* * * * *